United States Patent
Wu et al.

[11] Patent Number: 5,773,317
[45] Date of Patent: Jun. 30, 1998

[54] TEST STRUCTURE AND METHOD FOR DETERMINING METAL-OXIDE-SILICON FIELD EFFECT TRANSISTOR FRINGING CAPACITANCE

[75] Inventors: Koucheng Wu, San Antonio; Yu-Pin Han, Dallas, both of Tex.; Ying-Tsong Loh, Saratoga, Calif.

[73] Assignee: VLSI Technology Inc., San Jose, Calif.

[21] Appl. No.: 572,944

[22] Filed: Dec. 15, 1995

[51] Int. Cl.⁶ .................................................. H01L 21/66
[52] U.S. Cl. .......................... 438/17; 438/14; 438/18
[58] Field of Search ................. 438/14, 17, 18, 438/11

[56] References Cited

U.S. PATENT DOCUMENTS

| | | | |
|---|---|---|---|
| 4,978,627 | 12/1990 | Liu et al. | 438/17 |
| 4,994,736 | 2/1991 | Davis et al. | 438/18 |
| 5,206,598 | 4/1993 | Yokoyama | 438/17 |
| 5,217,907 | 6/1993 | Bulucea et al. | 438/17 |

*Primary Examiner*—Kevin Picardat
*Attorney, Agent, or Firm*—Majestic, Parsons, Stebert & Hsue

[57] ABSTRACT

The use of a test chip having a wide channel MOSFETs of different channel widths and effective gate lengths allows for an experimental determination of the fringe capacitance per unit width. The use of channel widths greater than 100 microns increases the accuracy of the measured capacitance values.

18 Claims, 3 Drawing Sheets

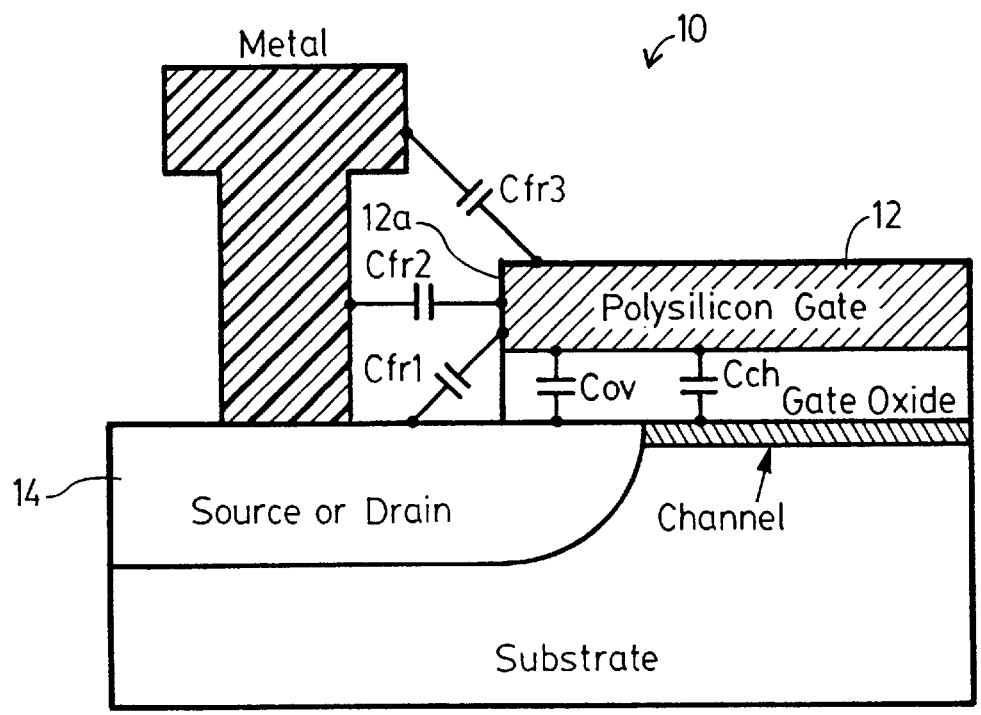
FIG._1.
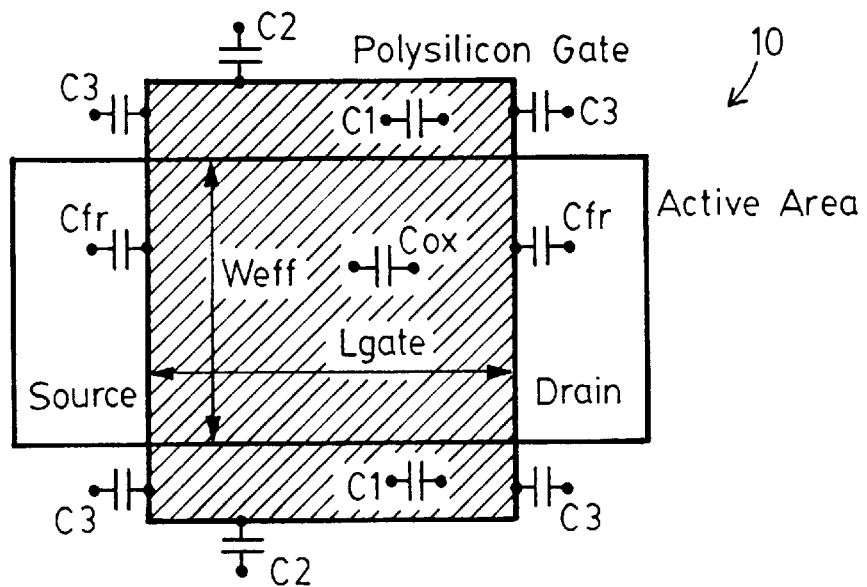
FIG._2.

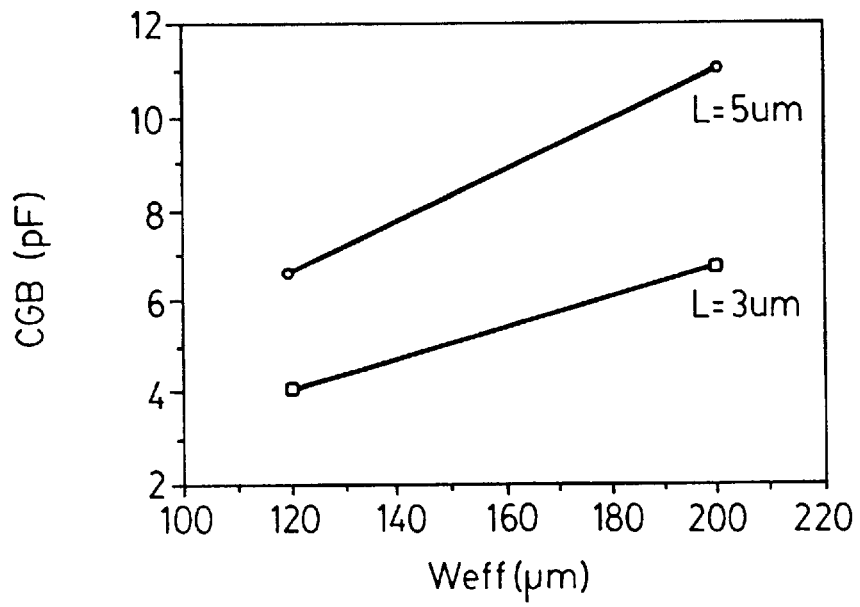
FIG._3.
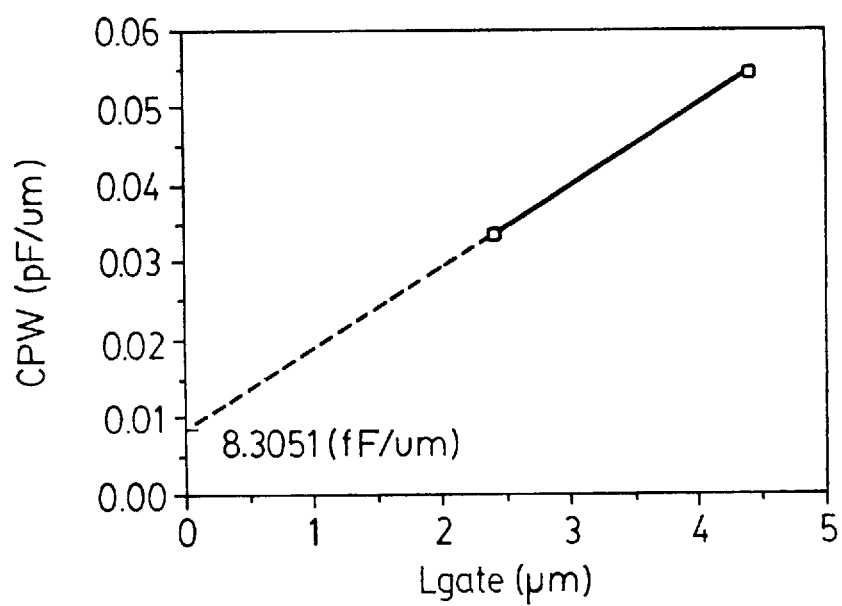
FIG._4.

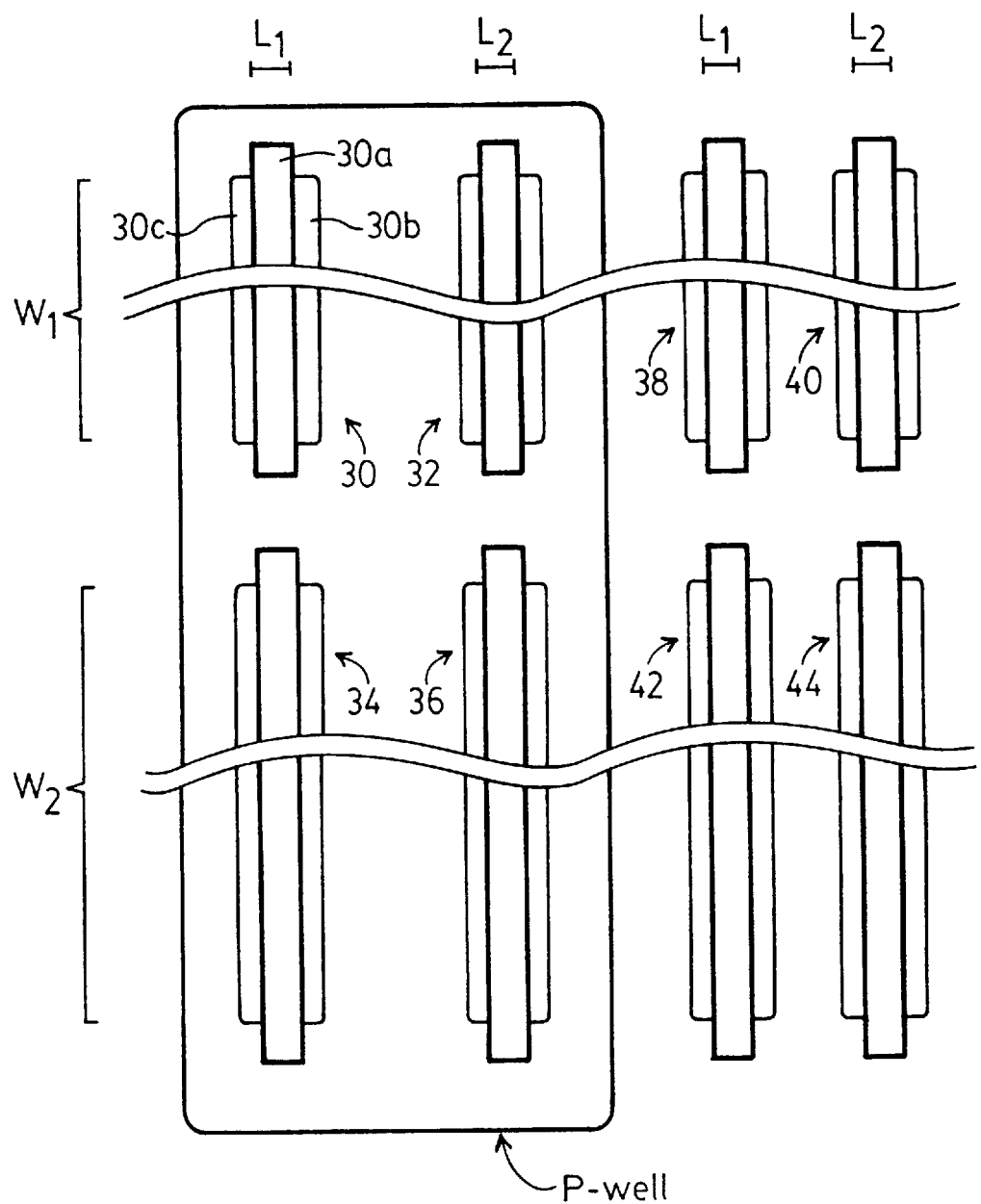
FIG._5.

TEST STRUCTURE AND METHOD FOR DETERMINING METAL-OXIDE-SILICON FIELD EFFECT TRANSISTOR FRINGING CAPACITANCE

BACKGROUND OF THE INVENTION

This invention relates to a method and apparatus for determining the fringing capacitance per unit width component of the total gate-to-substrate capacitance of metal-oxide-silicon field effect transistors (MOSFETs).

The fringing capacitance is an important device modeling parameter for high-speed circuit design and time-domain circuit simulation. As the size of the metal-oxide-silicon (MOS) devices continues to be reduced by new process technologies, the intrinsic speed of metal-oxide-silicon field effect transistors increases due to the reduction of channel length. The circuit speed will be limited by the resistance/capacitance (RC) delay of the parasitic resistance and parasitic capacitance of the devices and interconnect lines. The fringing capacitance becomes increasingly important to small geometry MOS devices because the fringing capacitance does not decrease as a design rule is scaled down.

Prior determinations of the fringing capacitance per unit width had been analytical ones which use models to estimate the fringing capacity per unit width. For example, E.W. Greeneich, "An Analytical Model for the Gate Capacitance of Small-Geometry MOS Structures," *I.E.E.E. Transactions on Electronic Devices*, Vol. ED-30, No. 12, pp. 1838–1839, Dec. 1983. A disadvantage of the analytical method described in this paper is that the gate to source/drain electrode capacitance component of the fringing capacitance is ignored. This is because the source/drain electrodes normally have irregular shapes and the distance between the gate and source/drain electrodes is not constant.

It is desired to have a method and apparatus for determining the fringing capacitance per unit width for a given process. It is especially desired that the estimation of the fringing capacitance includes a component due to the gate-to-source/drain electrode capacitance.

SUMMARY

Using an experimental test structure the present invention allows for an experimental determination of the fringing capacitance per unit width. The experimental determination of the fringing capacitance allows for the gate-to-metal component of the fringing capacity to be included in the estimation of the fringing capacitance. The experimental test chip and method uses MOSFETs with various effective channel widths and gate lengths. Since the gate-to-substrate capacitance can be estimated as a linear equation in terms of the gate lengths and channel widths, the use of four MOSFETs on the test chip having combinations of first and second gate lengths and channel widths allows for the estimation of the fringing capacitance per unit width. In a preferred embodiment, four MOSFETs are provided for N-channel devices and four MOSFETs are provided for P-channel devices. This allows for the determination of a value of the fringing capacitance per unit width for both P-channel and N-channel type MOSFETs.

The value of the fringing capacitance per unit width depends upon specific general process variables. These variables include the spacing design rule, overlap of the metal layer, and the polygate thickness. Such variables are generally fixed for a given process type. A variety of different designs are made from a given process over the process lifespan of about three years or so. During that time period, the estimate of the fringing capacitance per unit width obtained with the test chip would be valid. A new value from a new test chip can be obtained when the process is modified.

In a preferred embodiment, the channel widths used to determine the fringing capacitance are much wider than are typically used with MOSFETs. Typically MOSFETs' channel widths are made as small as possible, currently around 1 micron. In the preferred embodiment, the channel widths on the test chip are greater than 50 microns and preferably greater than 100 microns. Such a large channel width reduces the measurement error involved in the determination of the capacitances.

BRIEF DESCRIPTION OF THE DRAWINGS

The above and other features and aspects of the present invention will become more apparent upon reading the following detailed description in conjunction with the accompanying drawing.

FIG. 1 is a diagramic view of a cross-section of a MOSFET.

FIG. 2 is a diagram of a top view of a MOSFET showing the parasitic capacitances.

FIG. 3 is a graph showing the gate-to-substrate capacitances as a function of the effective channel width.

FIG. 4 is a graph of capacitance per unit width versus the gate length.

FIG. 5 is a diagramic view of a test chip showing N and P-channel MOSFETs with different gate lengths and channel widths.

DETAILED DESCRIPTION OF THE PREFERRED EMBODIMENT

Test structures and methods have been developed to experimentally determine the fringing capacitance of MOS transistors. The fringing capacitance is proportional to the channel width, but independent of the channel length and bias condition. See H. Iwai, J. E. Oristian, J. T. Walker, and R. W. Dutton, "A Scalable Technique for Measurement of Intrinsic MOS Capacitance with Atto-Farad Resolution," *IEEE Transactions on Electronic Devices*, Vol. ED-32, No. 2, pp. 344–356, Feb. 1985.

FIG. 1 is a cross-section of a MOSFET 10. Since the polysilicon gate 12 and source or drain 14 are heavily doped, the gate-to-source/drain capacitance, shown as $CFR_1$ is independent of bias. The gate-to-source/drain electrode capacitances, shown as $C_{FR2}$ and $C_{FR3}$, are constant and independent of bias.

If a MOSFET is biased in the linear region and the contacts of the source and drain are tied to the substrate, the gate to substrate capacitance, CGB, can be express as $$CGB = C_{ox} L_{gate} W_{eff} + CFR\ W_{eff} + (C1+C2) L_{gate} + C3$$

where $L_{gate}$ is the gate length, $W_{eff}$ is the effective channel width, $C_{ox}$ is the oxide capacitance per unit area, and CFR is the fringing capacitance per unit width. C1 is the gate to substrate capacitances through the field oxide. C2 and C3 are the gate-to-substrate capacitances from the sidewall 12a through the field oxide to the substrate. These capacitances are best illustrated with respect to FIG. 2.

It should be noted that the gate length $L_{gate}$ is used in the above equation, not the effective channel length $L_{eff}$ since the fringe capacitance does not include the overlap capacitance $C_{ov}$ as shown in FIG. 1. From the above equation, the gate-to-substrate capacitance is a linear function of a channel width.

FIG. 3 is a graph of the total gate-to-substrate capacitance as a function of the effective channel width for two different channel lengths. The capacitance per unit width CPW, which is the slope of the gate to substrate capacitance versus the $W_{eff}$ shown in FIG. 1 can be written as $$CPW=C_{ox}L_{gate}+CFR$$

CPW is a linear function in terms of the gate length. It is not important whether the effective channel width, $W_{eff}$, or drawn channel width, $W_{drawn}$, is used in this method, because only the capacitance per unit width is important to the fringing capacitance.

FIG. 4 is a graph showing the capacitance per unit width versus the gate length. The fringing capacitance can be extrapolated to the CPW axis giving the portion of CPW that is not dependent upon the gate length. In this manner the fringing capacitance per unit width is determined. For the example shown in FIGS. 3 and 4, the fringing capacitance per unit length is estimated at 8.3051 fF/micro.

The length shown in FIG. 3 is the drawn length. The lengths shown in FIG. 4 are the effective lengths. For this process, the $L_{gate}$ is about 0.6 microns smaller than the drawn length. The difference between the $L_{gate}$ and the drawn length depends upon the process steps. This difference can be determined for a given process by a well-known conductance method. This conductance test uses Kelvin polysilicon resistors of different widths to determine the change in length between the drawn and effective lengths of a MOSFET. Alternately, a cross-section of a wafer can be used in an optical method to determine the change in length between the drawn and effective lengths.

In a preferred embodiment, the capacitance is measured by inductance/capacitance/resistance (LCR) meter such as the LCR meter HP4275 available from Hewlett Packard of Palo Alto, Calif.

The test structures for extracting the fringing capacitance include wide channel devices with different channel lengths and widths. FIG. 5 is a top view of a test chip showing MOSFETs of different channel lengths and widths. Devices of length, $L_1$ and $L_2$, and widths, $W_1$ and $W_2$, are also shown. MOSFET devices 30, 32, 34, 36 are N-channel devices. MOSFET devices 38, 40, 42 and 44 are P-channel devices. MOSFET device 30 is comprised of a gate 30A, source 30B and drain 30C. The fringing capacitance per unit width can be obtained from the measured gate-to-substrate capacitances for both types of channel MOSFETs with a different lengths and widths.

The gate-to-substrate capacitances are measured for devices biased in the strong inversion (linear) region and source drain contacts are connected to the substrate. Ideally the fringing capacitance should remain constant in the linear region. In a preferred embodiment, a supply voltage of 3–5 volts is supplied to the gates to bias the MOSFETs in the linear region. The source drain and substrate can be connected together outside of or on the test chip.

Various details of the implementation and method are merely illustrative of the invention. It will be understood that various changes in such details may be within the scope of the invention, which is to be limited only by the appended claims.

What is claimed is:

1. A method of determining the fringing capacitance per unit width of a semiconductor process comprising the steps of:

providing a test chip containing metal-oxide-silicon field effect transistors, the chip including a metal-oxide-silicon field effect transistor having a first channel width and a first gate length, another metal-oxide-silicon field effect transistor having the first channel width and a second gate length, yet another metal-oxide-silicon field effect transistor having a second channel width and the first gate length, and still yet another metal-oxide-silicon field effect transistor having the second channel width and the second gate length, the channel width of the metal-oxide-silicon field effect transistors being greater than the minimum channel width obtainable with the process used to form the chip;

operating the metal-oxide-silicon field effect transistors in the linear region;

measuring the capacitance of the metal-oxide-silicon field effect transistors; and determining from the measurements the fringing capacitance per unit width for this process from the measured capacitance values.

2. The method of claim 1, wherein the determining step includes determining two values for the dependence of the gate to substrate capacitance on channel width, one value for each of the two different gate length values.

3. The method of claim 1, wherein the determining step further comprises determining the portion of the capacitance that is linearly dependent on channel width but not linearly dependent on gate length.

4. The method of claim 1, further comprising the step of using the fringing capacitance per unit width value in a computer modeling program.

5. The method of claim 1, wherein the providing step is such that
at least one of the effective channel widths is over 100 microns.

6. The method of claim 1, wherein the measuring step is such that the source, drain and substrate are electrically tied together.

7. The method of claim 1, wherein the providing step is such that the metal-oxide-silicon field effect transistor, another metal-oxide-silicon field effect transistor, yet another metal-oxide-silicon field effect transistor, and still yet another metal-oxide-silicon field effect transistor are P-channel field effect transistors, and wherein the determining step is such that a P-channel fringing capacitance per unit width is determined.

8. The method of claim 7, wherein the providing step is such that at least four N-channel metal-oxide-silicon field effect transistors are on the chip and the method further comprises determining an N-channel fringing capacitance per unit width.

9. The method of claim 1, wherein the providing step is such that the gates of the metal-oxide-silicon field effect transistors are adjacent to a metalization layer and wherein the determining step is such that the fringing capacitance per unit width includes a gate-to-metal component.

10. A test chip for determining the fringing capacitance for a semiconductor process containing metal-oxide-silicon field effect transistors, the chip including a metal-oxide-silicon field effect transistor having a first channel width and a first gate length, another metal-oxide-silicon field effect transistor having the first channel width and a second gate length, yet another metal-oxide-silicon field effect transistor having a second channel width and the first gate length, and still yet another metal-oxide-silicon field effect transistor having the second channel width and the second gate length, the channel width of the metal-oxide-silicon field effect transistors being greater than the minimum channel width obtainable with the process used to form the chip, the test chip allowing for the capacitance testing of the metal-oxide-silicon field effect transistors such that the fringing capacitance value per unit width can be experimentally determined.

11. The test chip of claim 10, wherein at least one of the channel widths of the metal-oxide-silicon field effect transistors is over 50 microns.

12. The test chip of claim 11, wherein the channel widths of the metal-oxide-silicon field effect transistors are over 50 microns.

13. The test chip of claim 11, wherein at least one of the channel widths of the metal-oxide-silicon field effect transistors is over 100 microns.

14. The test chip of claim 13, wherein the channel widths of the metal-oxide-silicon field effect transistors are over 100 microns.

15. The test chip of claim 10, wherein the source, drain and substrate of the metal-oxide-silicon field effect transistors are electrically tied together.

16. The test chip of claim 10, wherein the metal-oxide-silicon field effect transistor, another metal-oxide-silicon field effect transistor, yet another metal-oxide-silicon field effect transistor, and still yet another metal-oxide-silicon field effect transistor are P-channel field effect transistors.

17. The test chip of claim 16, wherein the test chip further comprises at least four N-channel metal-oxide-silicon field effect transistors.

18. The test chip of claim 10, wherein the gates of the metal-oxide-silicon field effect transistors are adjacent to a metalization layer.

* * * * *